United States Patent
Esposito

(10) Patent No.: US 11,721,971 B2
(45) Date of Patent: Aug. 8, 2023

(54) CONFIGURABLE ISOLATOR

(71) Applicant: Frederic Vladimir Esposito, Luton (GB)

(72) Inventor: Frederic Vladimir Esposito, Luton (GB)

(73) Assignee: EATON INTELLIGENT POWER LIMITED, Dublin (IE)

( * ) Notice: Subject to any disclaimer, the term of this patent is extended or adjusted under 35 U.S.C. 154(b) by 1235 days.

(21) Appl. No.: 16/079,382

(22) PCT Filed: Jan. 25, 2017

(86) PCT No.: PCT/GB2017/050187
§ 371 (c)(1),
(2) Date: Aug. 23, 2018

(87) PCT Pub. No.: WO2017/144845
PCT Pub. Date: Aug. 31, 2017

(65) Prior Publication Data
US 2019/0058325 A1    Feb. 21, 2019

(30) Foreign Application Priority Data

Feb. 23, 2016   (GB) .................................... 1603108

(51) Int. Cl.
*H02H 9/00*      (2006.01)
*G05B 19/042*    (2006.01)
(Continued)

(52) U.S. Cl.
CPC ......... *H02H 9/008* (2013.01); *G05B 19/0428* (2013.01); *H01R 13/434* (2013.01);
(Continued)

(58) Field of Classification Search
CPC .... H02H 9/008; H02H 3/006; G05B 19/0428; H01R 13/434; H05K 3/222; H05K 3/306;
(Continued)

(56) References Cited

U.S. PATENT DOCUMENTS

| | | |
|---|---|---|
| 1,815,233 A | 7/1931 | Burke |
| 4,099,216 A | 7/1978 | Weberg |

(Continued)

FOREIGN PATENT DOCUMENTS

| | | |
|---|---|---|
| DE | 196829528 C1 | 2/2000 |
| WO | 99/21332 A1 | 4/1999 |

(Continued)

OTHER PUBLICATIONS

Paul S. Babiarz, Making Start with the Field Device, Jan. 1, 2005, 20 pages.

(Continued)

*Primary Examiner* — Bryan R Perez
(74) *Attorney, Agent, or Firm* — Stinson LLP

(57) ABSTRACT

The present invention provides for an electronic isolator device for application in intrinsically safe environments having isolation and safety functionality and comprising: an isolator module (101), a safety module (100), and wherein the isolator module is arranged for removable physical/electrical connection to the safety module in at least two orientations/configurations (DO, DI, AI, AO) relative to the safety module, wherein the electrical connection to the safety module in each of the at least two orientations/configurations serves to configure the electrical functionality of the safety module (100).

13 Claims, 4 Drawing Sheets

(51) Int. Cl.
*H01R 13/434* (2006.01)
*H02H 3/00* (2006.01)
*H05K 1/02* (2006.01)

(52) U.S. Cl.
CPC ... *H02H 3/006* (2013.01); *G05B 2219/24028* (2013.01); *H05K 1/029* (2013.01); *H05K 1/0257* (2013.01); *H05K 2201/0746* (2013.01); *H05K 2201/09954* (2013.01); *Y02B 70/30* (2013.01); *Y04S 20/20* (2013.01)

(58) Field of Classification Search
CPC ...... H05K 3/303; H05K 1/0257; H05K 1/029; H05K 1/14; H05K 1/0268; H05K 1/0295; H05K 2203/168; H05K 2203/163; H05K 2203/173; H05K 2201/0746; H05K 2201/09954; H05K 2201/10287; H05K 2201/10689; H05K 2201/10734; H05K 2201/10151; H05K 2201/10704; H05K 2201/10325; H05K 13/08; H01L 23/50; H01L 2924/00; H01L 2924/0002
See application file for complete search history.

(56) References Cited

U.S. PATENT DOCUMENTS

| | | |
|---|---|---|
| 5,144,517 A | 9/1992 | Wieth |
| 5,158,464 A | 10/1992 | Landrini |
| 5,564,086 A | 10/1996 | Cygan et al. |
| 6,384,350 B1 | 5/2002 | Shincovich et al. |
| 6,454,585 B1* | 9/2002 | Homer ............... H05K 1/117 439/151 |
| 2005/0057277 A1 | 3/2005 | Chen et al. |
| 2006/0050495 A1* | 3/2006 | Warner ............... H01R 29/00 361/786 |
| 2008/0041930 A1 | 2/2008 | Smith et al. |
| 2010/0117453 A1 | 5/2010 | Langgood et al. |
| 2012/0007736 A1 | 1/2012 | Worthington et al. |
| 2015/0091390 A1* | 4/2015 | Syal ............... H05K 3/303 307/125 |
| 2015/0229121 A1 | 8/2015 | Davidson |
| 2015/0296598 A1 | 10/2015 | Haid et al. |
| 2016/0226162 A1 | 8/2016 | Emi |

FOREIGN PATENT DOCUMENTS

| | | |
|---|---|---|
| WO | 2004010083 A2 | 1/2008 |
| WO | 2014147093 A1 | 9/2014 |
| WO | 2015/066007 A1 | 5/2015 |

OTHER PUBLICATIONS

Eaton, Surge Protective Devices Introduction, 4 pages, Nov. 1, 2012.
Eaton, Surge Protection Solutions for High Energy Surges and Transient Disturbances Capabilities Overview, 8 pages, Aug. 31, 2016.
International Search Report for PCT/GB2017/050187, dated Jun. 14, 2017, 2 pages.

* cited by examiner

CONFIGURABLE ISOLATOR

CROSS-REFERENCE TO RELATED APPLICATIONS

This application is a National Stage Entry of, and claims priority to, PCT Patent Application No. PCT/GB2017/050187, filed Jan. 25, 2017, which claims priority to United Kingdom Patent Application No. GB1603108.0, filed Feb. 23, 2016, both of which are hereby incorporated by reference in their entirety.

The present invention relates to a universal isolator and, in particular to a universal isolator arranged for providing isolation for devices located within an intrinsically safe environment.

Safety devices offering isolation and, for example, barrier safety functionality have been widely used as part of process-control systems and, in particular, process-control systems operating in relation to intrinsically safe environments.

Traditionally isolator devices have been provided having pre-set functionality offering the appropriate combination of safety components with regard to the operational requirements of the system within which the isolator is provided.

However, recently there has been the emergence of so-called universal isolators which comprise single devices which can be configured to operate in a selected one of a variety of possible operational configurations having regard to the operational requirements of the process control system. Again, such known universal isolators are commonly provided for use in relation to intrinsically safe environments, and in which the requirements of such deployment serves to emphasise limitations and disadvantages found in relation to known universal isolators.

For example, and with regard to a universal isolator offering intrinsic safety as an Ex-i type universal isolator, the safety elements are fixed and are not in any way adaptable to the mode in-which the isolator is arranged to operate. For example, a Digital Input (DI) could require voltage/current maximum available values of 13V/14 mA; whereas a Digital Output (DO) can be required to offer a 27V output and also a variety of different current values depending upon the application that the isolator is operatively connected to. While it has been known to try to resolve the problem by providing different pins with accordingly different connections, this does not cover all required possibilities, and is further disadvantageous in that the wrong connection on a hazardous cable is potentially very dangerous.

The present invention seeks to provide for a universal isolator having advantages over known such isolators.

In particular, the present invention seeks to provide for the ready selectability of safety components within a universal isolator having regard to the mode of operation of the isolator.

According to one aspect of the present invention, there is provided an electronic isolator device having isolation and safety functionality and comprising: an isolator module, a safety module, and wherein the isolator module is arranged for removable physical/electrical connection to the safety module in at least two orientations/configurations relative to the safety module, wherein the electrical connection to the safety module in each of the at least two orientations/configurations serves to configure the electrical functionality of the safety module.

The invention is therefore advantageous in providing for automatic selection of the correct safety components having regard to the mode with which the isolator is to operate. The invention is particularly advantageous insofar as it serves to separate the isolation electronics from the safety electronics thereby allowing for appropriate choice of the safety components responsive to the selected manner of connection of the isolation electronics to the safety electronics.

Advantageously, the safety module comprises a barrier module.

Further, the isolator advantageously comprises universal isolator.

Also, the isolator is arranged to provide isolation for devices operating within an intrinsically safe environment.

Yet further, the number of potential orientations/configurations of the safety module can be equal to at least the number of sides of the safety module offering connectivity, Additionally it is also possible to employ each side twice by turning/flipping the safety module 180 degrees. Advantageously, the electrical functionality to be configured by the safety module orientation/configuration can comprise at least one of input and/or output voltage.

It should also be appreciated that different functionality can be achieved simply by shifting the position of the isolator module with respect to the safety module. However, it should also be appreciated that the module can also provide for any selectable functionality, For example, different measurement functionalities such as with an mV, RTD and/or Thermocouple measurement module could be provided as part of the isolation.

Yet further, the electrical functionality to be configured by the safely module orientation/configuration can advantageously comprise at least one of digital and/analog domain. Thus, it will be appreciated that the selective physical/electrical connectability of the safety module provides for appropriate selection of safety components having regard to the functionality of the isolator as required by the system within which is it to be deployed.

Thus, by separating the isolation electronics from the safety electronics, it proves possible to automatically connect the isolation module to the correct safety element if the connection is designed for such an appropriate feature. For example, plugging the isolator into a safety unit in the DI position will not only indicate the mode selected, but will actually also select the 13V/14 mA input safety components. The hazardous connectors can then be used safely without the risk of incorrect-wiring/connection.

Advantageously, the manner of physical connection of the isolator module to the safety module provides for a visual indication of the mode of operation selected.

The invention is described further hereinafter by way of example only, with reference to the accompanying drawings in which.

Each of the four drawings schematically shows an electronic isolator device embodying the present invention and in which the same isolator module and barrier module are connected in four different orientations/configurations—that is with the effectively rotatable isolator connected to a barrier section in accordance with each of four different connection configurations.

Figure 1:
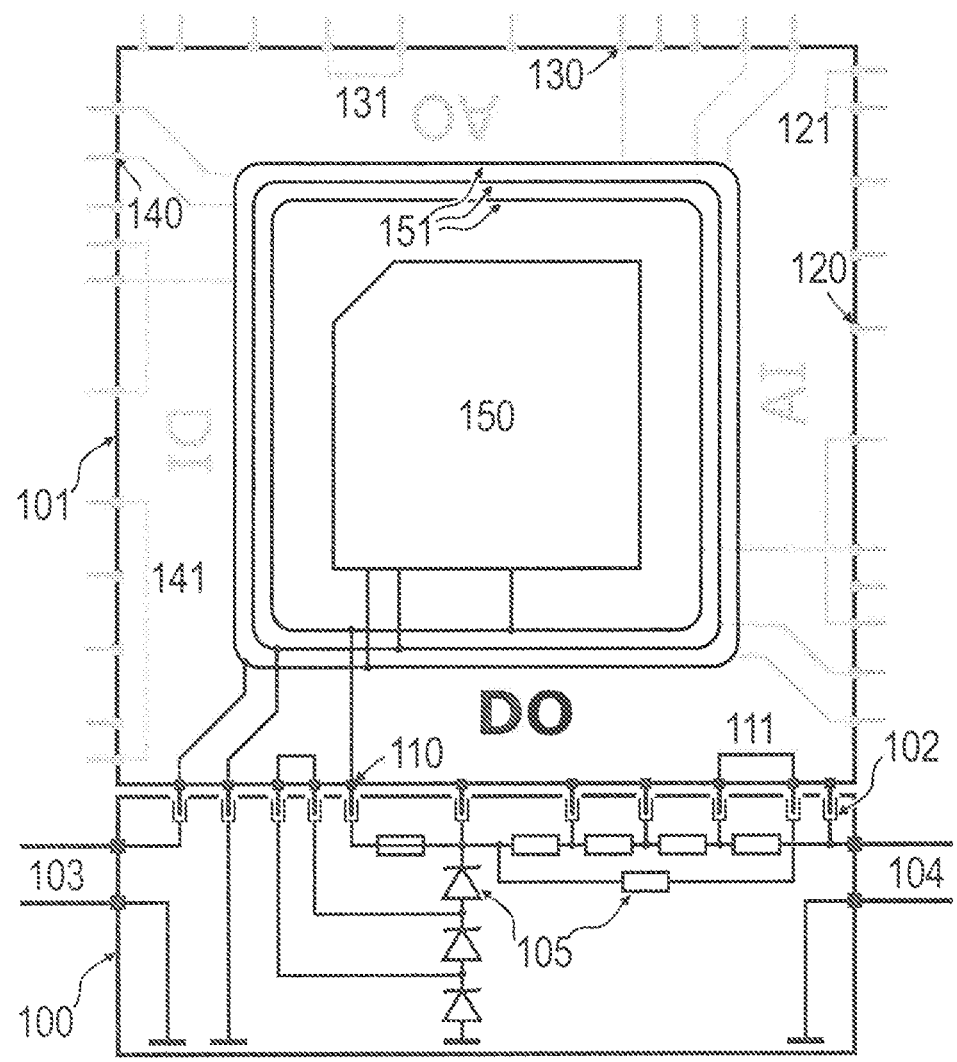
FIG. 1 is a schematic representation of an isolator device embodying the present invention and having an isolator module and a barrier module with the two modules connected in one orientation/configuration.

Turning first to FIG. 1, there is illustrated an isolator including barrier functionality such as may be employed as an isolator/barrier in relation to field device operating in an intrinsically safe environment.

The functional electronic device comprises a barrier section 100 which, in accordance with the invention, effectively comprises a barrier base portion to which is connected an isolator portion 101 effectively comprising a removable and rotatable, portion, rotatable also for example in a clockwise direction as illustrated for reference in the drawings. The module is arranged to allow for reconnection of the rotatable isolator section 101 to the barrier base section 100, in a different configuration as reference to the drawings in sequence serves to indicate. With reference to the connection configuration of FIG. 1, it will be appreciated that the rotatable isolator section 101 is connected in the manner of a functional Digital Out "DO" to the barrier base section 100. As will be appreciated, in view of the connection pattern within the isolator section 101 and as, when configured in the example shown in FIG. 1, with connection to the barrier base section 100, connection is achieved for example by way of a connection 110 for the DO position, and DO configuration links 111. As is also clearly illustrated, the barrier base section 100 includes a variety of elements such as a single connector 102, safety components 105, hazardous side lines 104 and safe side lines 103.

The isolator section 101 includes other connection portions such as a connector for the DI position 140, DI configuration links 141, connectors 120 for the AI position, AI configuration links 121, connectors 130 for the AO position and AO configuration links 131. However, as illustrated with reference to FIG. 1, these connection elements are not in active connection to the barrier base section 100 in view of the orientation/configuration of connection between the isolator section 101 and barrier base section 100.

FIG. 1 also illustrates connectivity of a processing section 150 of the isolator section 101 is achieved by way of lines 151 between the processing section 150 and the connection components.

Figure 2:
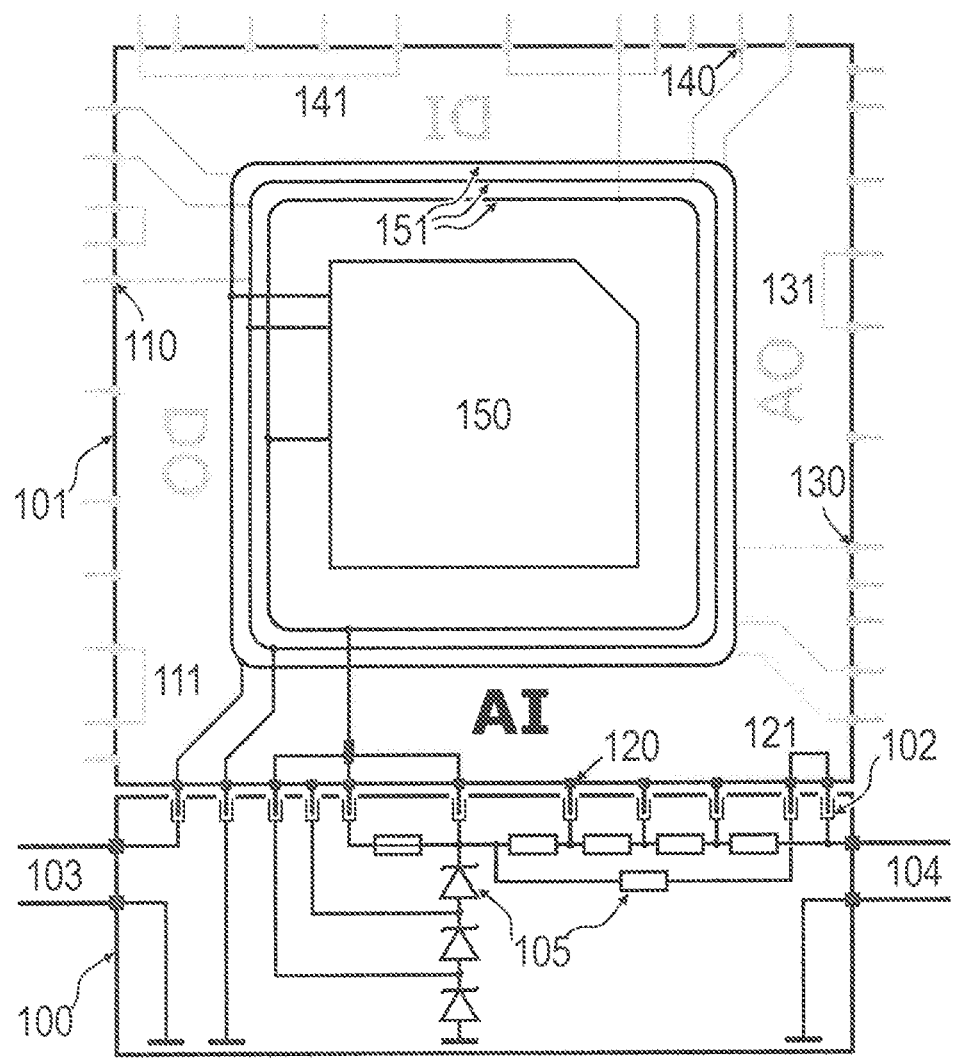
FIG. 2 is a similar schematic representation with the modules connected in a second orientation/configuration.

However, and referring now to FIG. 2, and subsequent to disconnection of the isolator section 101 from the barrier base section 100 as shown in FIG. 1, and subsequent to clockwise rotation (in the illustrated example) of the isolator section 101 so as to bring the DI edge connectors of the isolator section 101 into engagement with the connection elements of the barrier base section—such subsequent reconnection in a AI configuration is illustrated with FIG. 2.

Thus, the orientation/configuration of FIG. 2 now has connectors for the AI position 120 and AI configuration links 121 now connected to the barrier base section which is configured as a barrier 100 having safe side lines 103, hazardous side lines 104, safety elements 105 and a single connector on the base part 102 as illustrated.

Comparison between the connectivity of the DO section of the isolator section 101 of FIG. 1 with the connection of the AI section of the isolator 101 of FIG. 2 illustrate the different connectivity achieved with the functional base barriers 105 in a different manner serving to automatically select the appropriate/required voltage current values such that the safety functionality of the base barrier is varied each time through such different connection configurations effectively adapt to the mode of the isolator device.

As reference to FIG. 2 further illustrates, the isolator section 101 includes potential connectivity related to DO, DI and AO sides such as connectors 110 for the DO position, 140 for the DI section, and 130 for the AO section. Also, configuration links 111, 141 and 131 are provided for the DO, DI and AO sections respectively; and connectors for the AO, DI and DO sides which are effectively redundant in the configuration of FIG. 2.

As with FIG. 1, connectivity of a processing section 150 of the isolator section 101 of FIG. 2 is achieved by way of lines 151 between the processing section 150 and the connection components.

Disconnection and further rotation of the isolator section in a clockwise direction relative to the barrier base 100 then leads to the connections thus configurations illustrated with reference to FIG. 3. Here, the connectors 130 for the AO position and AO configuration links 131 now make a connection to the barrier base in accordance with the different configuration 100 and which again employs safe side lines 103, hazardous side lines 104 and safety components 105.

Figure 3:
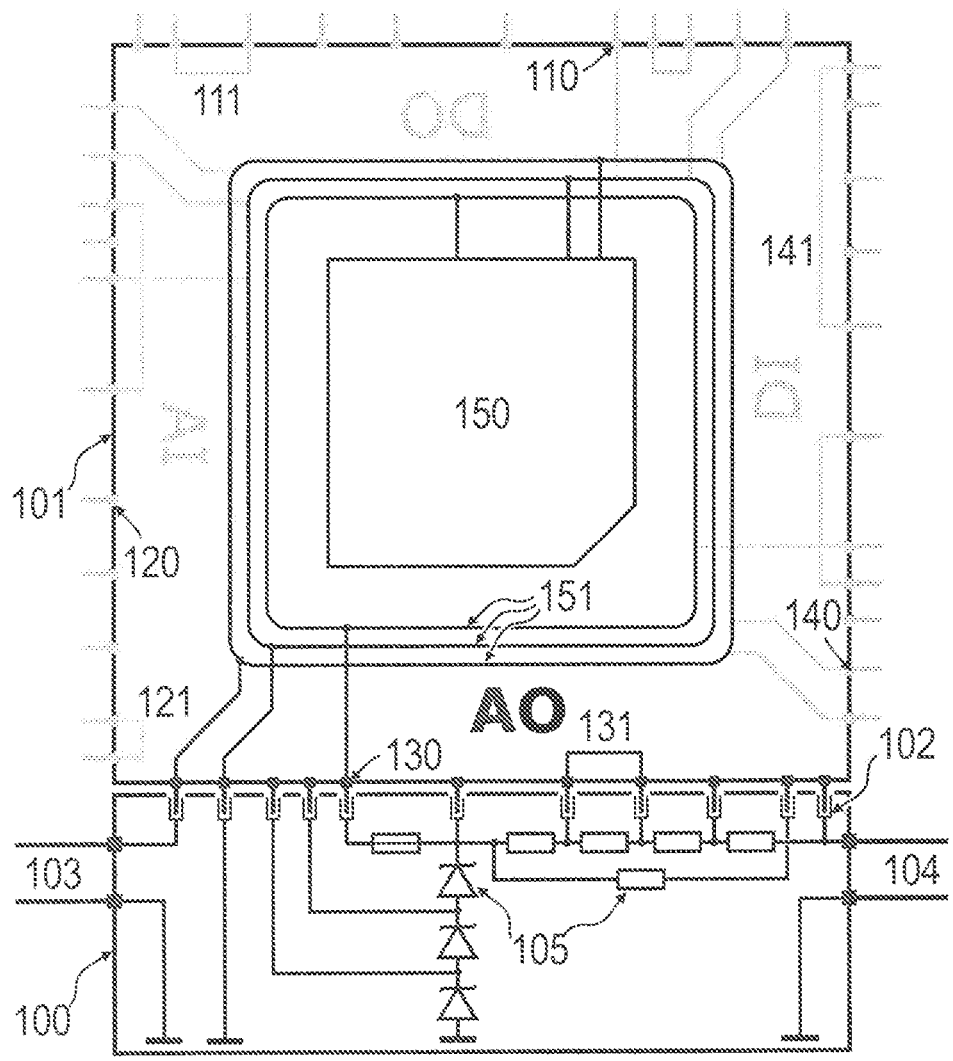
FIG. 3 is a yet further schematic representation with the modules connected in a third orientation/configuration.

In the illustrated arrangement of FIG. 3, connectivity comprising connectors 140, 110 and 120 for the respective DI, DO and AI sides are indicated along with DI configuration links 141, DO configuration links 111 and AI configuration links 121 and in this orientation/configuration as illustrated as redundant.

As with the earlier figures, connectivity in FIG. 3 of a processing section 150 of the isolator section 101 is achieved by way of lines 151 between the processing section 150 and the connection components.

Figure 4:
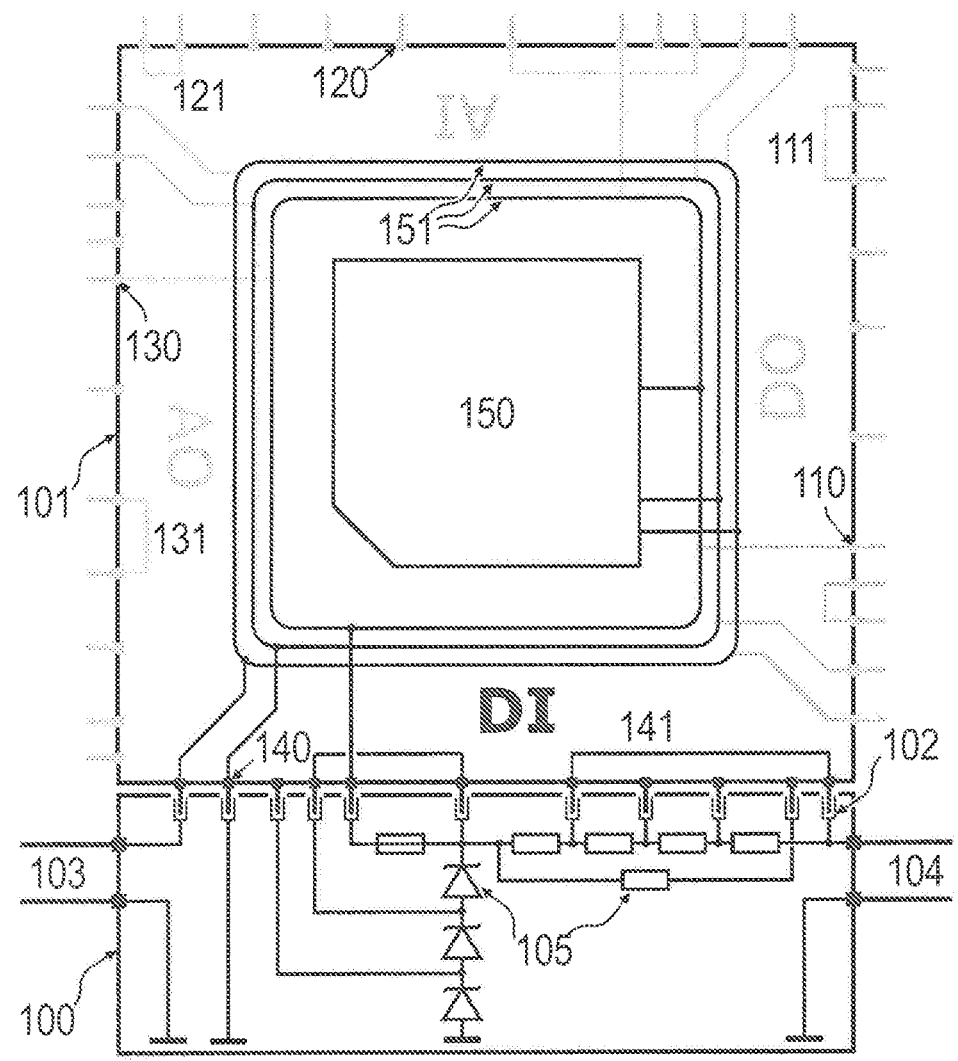
FIG. 4 is a schematic representation of the illustrated embodiment of the isolator device with the modules connected in accordance with a fourth orientation/configuration.

Finally, with reference to FIG. 4, there is illustrated a configuration/orientation in which the connectivity between the isolator section 101 and a base barrier section 100 is such that the device as a whole is arranged for DI functionality. Thus, in this embodiment, the connector 140 for the DI position and the DI configuration links 141 achieve connection to the base barrier 100 which again employs safe side lines 103, hazardous side lines 104 and safety electronics 105.

Again, a processing part 150 of the isolator section 101 achieves connectivity to the connection component by way of connectors 151.

Thus, as reference to FIG. 1-FIG. 4 will illustrate, through effectively separating the isolator electronics from the barrier/safety electronics, it becomes possible to select the appropriate safety components to the mode of which the isolator is running simply by connecting the appropriate set of connectors of each of the four respective sides of the isolator device 101 to the base barrier 100.

In the illustrated example, the selection of the appropriate set of connectors is determined by which of the four sides of the illustrated isolator device 101 is connected to the base barrier 100. That is which of the AI, AO, DI or DO sides is connected to the base barrier 100. However, alternative, and possibly further, options and selectability can be achieved by achieving different re-connection configurations through flipping/rotating/shifting the isolator device through 180 degrees. For example, and with reference to FIG. 1, the isolator device 101 could be simply disconnected and flipped 180 degrees around a vertical axis in the drawing and then reconnected. In this manner each of the four sides of the isolator device 101 of the Figures could provide for two connection/configuration options, allowing for eight possible options in total.

Yet further, the change in physical connection between the isolator and barrier also serves to provide an identifiable visual indication as to in-which of the four modes the barrier is connected for operation.

The orientation/configuration of the isolator device 101 relative to the base barrier 100 could also serve to indicate the nature of the processing running on the processing section 150.

As noted therefore, the present invention is advantageous in effectively automatically allowing for the selection of the correct safety components with regard to the mode with which the isolator is running and primarily through the separation of the isolation electronics from the safety electronics. Such separation allows for the automatic connection of an isolation module to the correct safety components if the connection is designed for such a feature. For example, plugging the isolator into the safety barrier unit in the DI position will not only indicate the mode selected, through visual inspection of the connection, but will also automatically, for example, select the appropriate 13V/14 mA connectors.

The external hazardous connectors can then be employed without risk of incorrect and dangerous wiring configurations.

The invention claimed is:

1. An electronic isolator device having isolation and safety functionality and comprising:
   an isolator module comprising a processing section,
   a safety module, and
   wherein the isolator module is arranged for removable connection to the safety module in at least two correct orientations relative to the safety module,
   wherein the connection to the safety module in each of the at least two correct orientations serves to configure the respective electrical functionality of the safety module, and wherein, in each of the at least two correction orientations, the connection comprises a connection to the processing section of the isolator module.

2. The electronic isolator device as claimed of claim 1, wherein the number of configurations of the safety module is equal to at least the number of regions of the safety module offering connectivity.

3. The electronic isolator device of claim 2, wherein different connectivity regions are provided on different sides of the safety module.

4. The electronic isolator device of claim 3, wherein at least one of the sides is arranged to provide for at least two different configurations.

5. The electronic isolator device of claim 1, wherein the safety module includes barrier functionality.

6. The electronic isolator device of claim 1, wherein the isolator module is configurable.

7. The electronic isolator device of claim 1, wherein the isolator module is multifunctional.

8. The electronic isolator device of claim 1, wherein the isolator module is universal.

9. The electronic isolator device of claim 1 in combination with one or more devices, the electronic isolator device arranged to provide isolation for the devices operating within an intrinsically safe environment.

10. The electronic isolator device of claim 1, wherein the electrical functionality to be configured by the safely module comprises at least one of input and/or output voltage/current.

11. The electronic isolator device of claim 1, wherein the electrical functionality to be configured by the safely module comprises at least one of digital and/analog domain.

12. The electronic isolator device of claim 1, wherein the connection of the isolator module to the safety module provides for a visual indication of the mode of operation selected.

13. The electronic isolator device of claim 1, wherein the connection of the isolator module to the safety module is arranged to provide for a visual indication of processing functionality of the electronic isolator device.

* * * * *